United States Patent [19]

Apel

[11] Patent Number: 4,467,293

[45] Date of Patent: Aug. 21, 1984

[54] FERRITE TYPE DIRECTIONAL COUPLER

[75] Inventor: Thomas R. Apel, Cedar Rapids, Iowa

[73] Assignee: Rockwell International Corporation, El Segundo, Calif.

[21] Appl. No.: 303,449

[22] Filed: Sep. 18, 1981

[51] Int. Cl.³ .............................................. H03H 7/00
[52] U.S. Cl. ..................................... 333/112; 333/119
[58] Field of Search ........................ 333/109, 112, 119

[56] References Cited

U.S. PATENT DOCUMENTS

| | | | |
|---|---|---|---|
| 2,734,169 | 2/1956 | Douma | 333/112 X |
| 2,756,282 | 7/1956 | Douma | 333/112 X |
| 3,048,798 | 8/1962 | Simons | 333/112 |
| 3,872,408 | 3/1975 | Reilly | 333/112 |

*Primary Examiner*—Paul L. Gensler

*Attorney, Agent, or Firm*—Richard K. Robinson; Howard R. Greenberg; H. Fredrick Hamann

[57] ABSTRACT

A directional coupler with a first and second transformer, having their primary windings connected in series, provides a sample of the current flow through the series connected primary windings. A third transformer provides a voltage sample of the voltage that results from the current flow through the primary windings of the first and second transformers. The voltage sample and the current sample are vectorially combined by a vector adder to obtain a first signal that is representative of the reflected power components of the current and voltage samples and also to provide a second signal that is representative of the forward power components of the current and voltage samples.

10 Claims, 9 Drawing Figures

FERRITE TYPE DIRECTIONAL COUPLER

The Government has rights in this invention pursuant to Contract No. DAAB07-78-C-0160 awarded by the Department of the Army.

BACKGROUND OF THE INVENTION

This invention relates to directional couplers and more particularly to four port directional couplers using multiple transformers.

A directional coupler is an electrical device that accepts high frequency signals from a high frequency source and transmits most of the high frequency power associated with the high frequency signal to its output terminals while providing a considerably smaller portion of the high power energy on its tapped outputs.

U.S. Pat. No. 3,776,499 disclosed a coupler arrangement that has an input, a main line output and a tapped output. A ferromagnetic core has a first and second axial bore. A first winding passes through the first bore and has one end connected to the input and a second end connected to the main line output. A second winding has a first terminal connected to the input, passes through the second bore and has a second terminal connected to ground. A third winding has a first end portion connected to the tapped output, passes through the second bore and has a second end portion connected to ground through a terminating resistor. A fourth winding has a first end portion connected to the tapped output, passes through the first bore and has a second end portion connected to ground potential. The first and fourth windings are wound through the bore and around the outside portion of the core in a first direction, while the third and fourth windings are wound in the opposite direction. The first and third windings have a number of turns which are much smaller than the number of turns of the second and fourth windings.

A broadband directional coupler is disclosed in U.S. Pat. No. 4,121,180 in which a four port directional coupler using two substantially identical transformers, each transformer having a turn ratio N with a substantially pure resistive impedance across both the transformer's secondary windings, and a substantially pure resistive impedance connecting the transformer's primary windings, whereby the coupling coefficient, C, of the directional coupler is a function of the resistive impedance and N is substantially a continuous function of the values of said resistive impedance for any independent selected value of N.

The prior art directional couplers, however, do have some limitations in the area of directivity. Directivity is a quality of merit of a directional coupler and indicates the ability of a directional coupler to separate forward power from reflected power.

SUMMARY OF THE INVENTION

A directional coupler with a first and second transformer, having their primary windings connected in series, provides a sample of the current flow through the series connected primary windings. A third transformer provides a voltage sample of the voltage that results from the current flow through the primary windings of the first and second transformers. The voltage sample and the current sample are vectorially combined by a vector adder to obtain a first signal that is representative of the reflected power components of the current and voltage samples and also to provide a second signal that is representative of the forward power components of the current and voltage samples.

Accordingly, it is an object of the present invention to provide a broadband directional coupler that has enhanced directivity over the prior art.

It is another object of the invention to provide a directional coupler that in combination with a transmission system provides a transmission system in which the output power of a radio transmitter can be adjusted to compensate for variations in the Voltage Standing Wave Radio (VSWR) of a transmission line that connects the radio transmitter to an antenna.

It is still another object of this invention to provide a directional coupler that may be operated over many octaves.

These and other objects, features and advantages of the present invention will appear more fully from the following description of the preferred embodiments taken in conjunction with the drawings.

DETAILED DESCRIPTION OF THE PREFERRED EMBODIMENT

Figure 1:
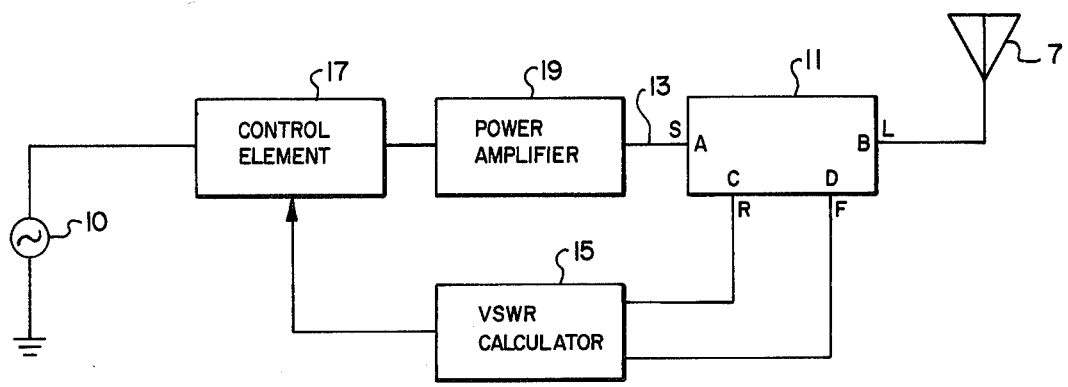
FIG. 1 is a block diagram of a transmission system that utilizes a directional coupler according to the invention.

FIG. 1, to which reference should now be made, is a block diagram of a transmission system that incorporates a directional coupler according to the invention. A radio frequency signal source 10, such as a radio transmitter, generates a radio signal for transmission by the antenna 7. A directional coupler 11 samples the forward and reflected power and applies signals that represent the sampled reflected power and forward power to a VSWR calculator 15. The VSWR calculator 15 provides a control signal to the control element 17 which adjusts the output of the radio frequency signal source 10 in response to the control signal. The output of the control element 17 is amplified by a power amplifier 19 and applied to the antenna 7 via the transmission line 13 and the directional coupler 11. The overall embodiment of the transmission system illustrated in FIG. 1 ensures that the forward power going out of the power amplifier 19 to the antenna 7 is constant over the frequency band of the radio frequency signal source 10. The ratio of the forward power to reflected power is made in the VSWR calculator and from that information it can be determined if the antenna is working properly or if the antenna is defective. In the presence of excess VSWR the control signal can provide a reduction in the forward output power from the power amplifier 19. This embodiment thus provides VSWR protection to the power amplifier 19. The radio frequency signal source 10 in the preferred embodiment operates from 30 to 88 megahertz, however, other applications could be 300 to 400 or 100 to 400 megahertz. In any case, the radio frequency signal source 10 is typically above 30 megahertz and has a multi-octave bandwidth.

Figure 2:
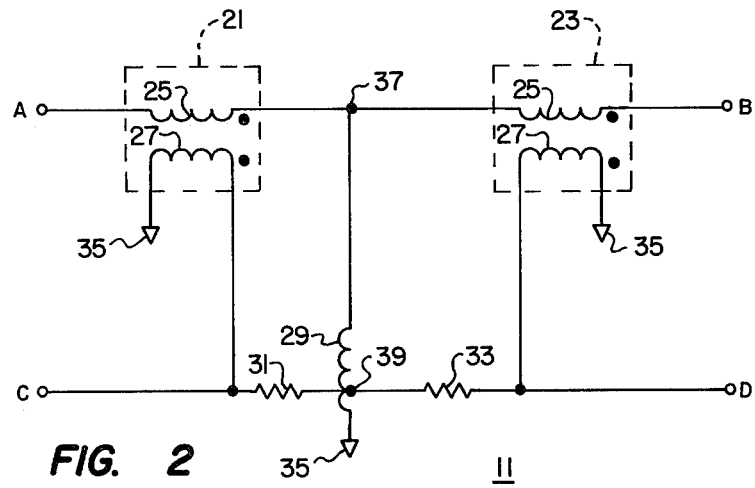
FIGS. 2, 4, 6 and 7 are schematic diagrams of four alternate embodiments of the directional coupler according to the invention.

In FIG. 2, to which reference should now be made, there is shown a directional coupler 11 that has four terminals A, B, C and D. There is a first current sense transformer 21 and a second current sense transformer 23. The current sense transformers have a primary winding 25 that are joined together at node point 37. Each current sense transformer has an inside secondary winding 27, the definition of which will be provided later. A voltage sense transformer 29, which in the preferred embodiment is an auto transformer, has a first input terminal also connected to the node point 37. A first resistor 31 connects the output terminal C to an output tap 39 of the voltage sense transformer 29. Also connected to the output terminal C is one leg of the inside secondary winding 27 of the current sense transformer 21. The other leg is connected to an electrical ground or reference potential 35 as is a common terminal of the voltage sense transformer 29. A second resistor 33 joins the output tap 39 of the voltage sense transformer 29 to the output terminal D. The output terminal D is also connected to the inside secondary winding 27 of the second current sense transformer 23. The other leg, the inside secondary winding 27 of the second current sense transformer 23, is also connected to the electrical ground or reference potential 35.

Figure 3:
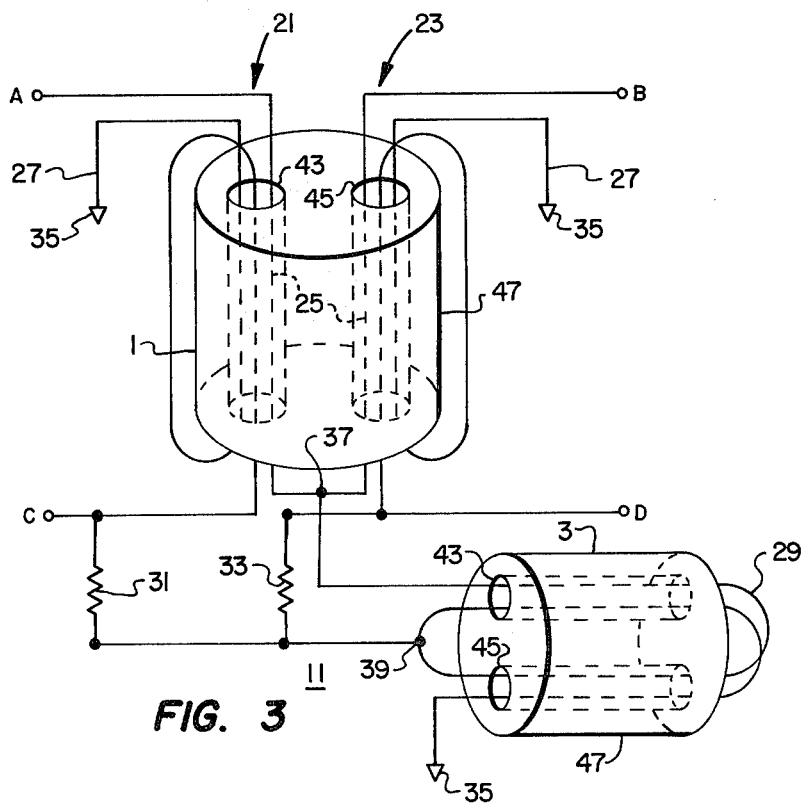
FIGS. 3 and 5 are electrical diagrams illustrating the alternate embodiments of the transformer windings.

FIG. 3 is an electrical diagram of the directional coupler 11 of FIG. 3 and includes a current probe 1 which comprises the first current sense transformer 21 and the second current sense transformer 23. The current probe 1 samples the current that flows from terminal A to terminal B and provides signals that are representative of the current flow from terminal A to terminal B that are vectorially combined with signals from a voltage probe 3. The current probe 1, as was discussed in conjunction with FIG. 2, includes a first current sense transformer 21 and a second current sense transformer 23 whose primaries 25 are series connected and run through a ferromagnetic core 47. The ferromagnetic core 47 increases the coupling between the primary and secondary windings and is commonly referred to in the art as a balun core or a binocular core because of its shape or prior use. Running through the ferromagnetic core 47 are two axial bores 43 and 45. Each of the currnt sense transformers has a secondary winding which, in the case of the embodiments of FIGS. 2 and 3, is an inside winding 27, so named because the first portion of the winding runs through the axial bores, either 43 or 45, of the ferromagnetic core 47. A voltage probe 3 which is the voltage sense transformer 29 is itself wrapped around a ferromagnetic core 47 that has a first axial bore 43 and a second axial bore 45. The winding of voltage sense transformer 29 is wound around a transformer winding path for MN turns where M is a positive integer and N is the turns ratio. The transformer winding path starts at node point 37, runs through the axial bore 43 across the base of the ferromagnetic core 47, through the axial bore 45 then across the front side of the ferromagnetic core 45 to the axial bore 43. The tapped point 39 is in the preferred embodiment located M(N−1) turns from the node 37. The voltage sample provided by the voltage sense transformer 29 is vectorially added to the voltage produced by the current samples that are provided by the first current sense transformer 21 and the second current sense transformer 23 by the resistors 31 and 33, to provide on either terminals C or D, signals that represent the reflected power or the forward power. The exact terminal upon which the representative signals appear are dependent on the connection of the directional coupler 11 in the circuit. In the example of FIG. 1, terminal A is connected to terminal S which is a source terminal and terminal B is connected to terminal L, the load terminal. Under these conditions, the reflected power is provided, as shown in FIG. 1, on terminal C and the R terminal of the transmission system of FIG. 1. The forward power is provided on terminal D and terminal F for application to the VSWR calculator 15 of FIG. 1. However, as shown in Table I, the reversing of the connections of terminals A and B also reverses the terminals from which the signals that represent the forward power and reflected power may be obtained.

Figure 4:
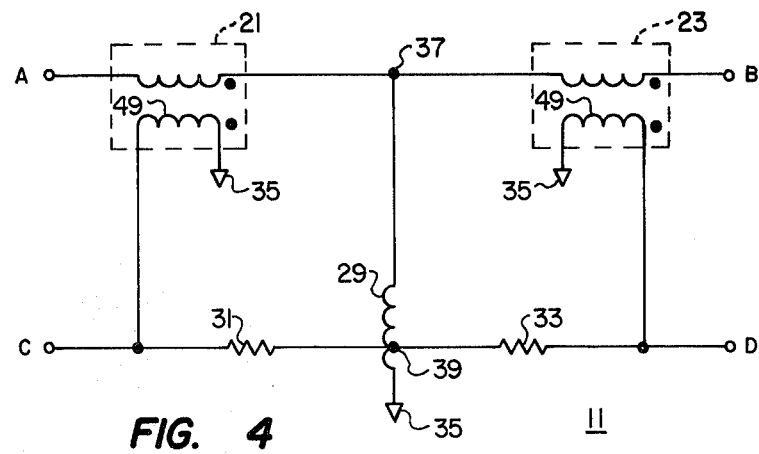

FIG. 4 is an alternate embodiment of the directional coupler 11 and provides for a first current sense transformer 21 and a second current sense transformer 23 being used to join terminal A to terminal B. Each current sense transformer has a secondary winding that is an outside winding 49 that is used to provide current samples of a current that flows from terminal A to terminal B to the vector adder that includes resistors 31 and 33. The voltage sense transformer 29 provides a voltage sample to the vector adder of the voltage that is present at node 37.

Figure 5:
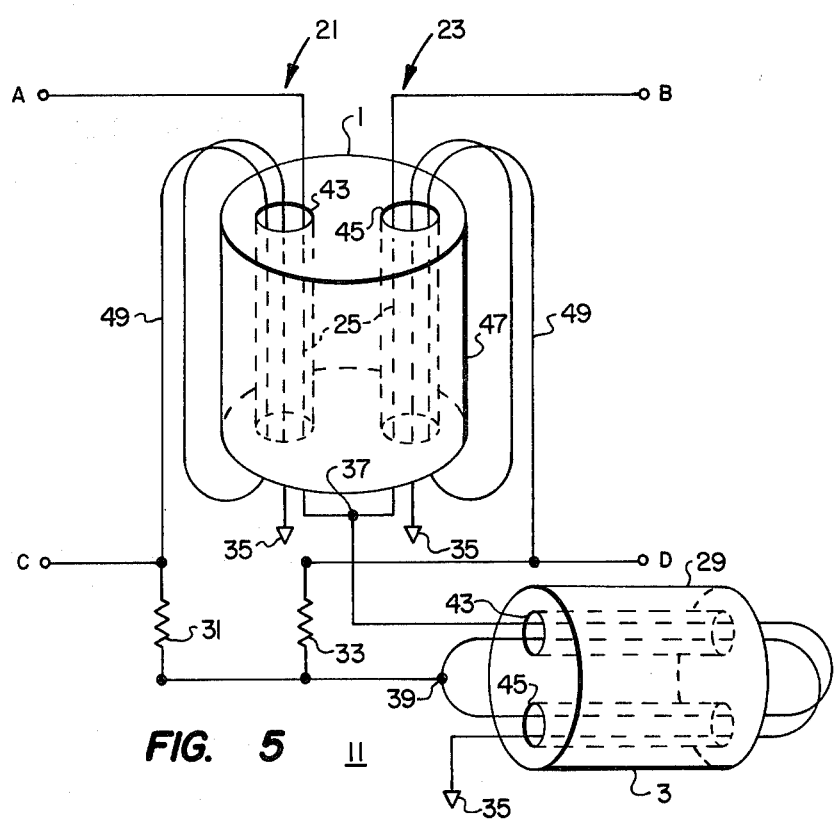

FIG. 5 is an electrical diagram of the directional coupler of FIG. 4 in which there is a current probe 1 with a first current sense transformer 21 and a second current sense transformer 23. The primary windings 25 of each transformer are serially connected at node point 37 and join terminal A to terminal B. Each current sense transformer has a secondary winding which is an outside winding and is designated so because the first part of the turn of the winding runs along the outside of the ferromagnetic core 47. The terms inside winding and outside winding are used to illustrate alternate embodiments of the invention. Alternatively, dot convention may be to indicate the direction of current flow in the secondary winding to be opposite or identical to the direction of current flow in the primary winding. The same results as with the inside and outside winding are thus obtained.

There is a voltage probe 3 which is an auto transformer that samples the voltage that is present at node point 37 and provides the voltage sample to the vector adder that includes the resistors 31, 33 for vectorially combining the current samples from the first current sense transformer 21 and the second current sense transformer 23 to provide a signal representative of the forward power and reflected power that is present on the transmission line in which the directional coupler 11 is serially connected. Table I provides the connections for the terminals A and B and also the terminals from which the reflected power and forward power may be obtained.

Figure 6:
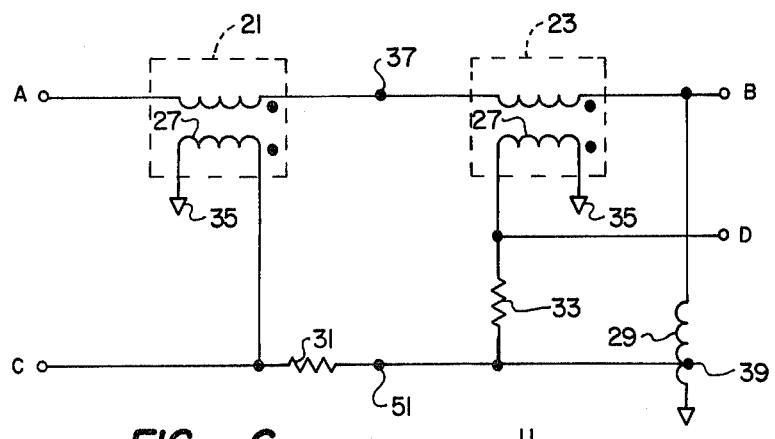

FIG. 6 is an alternate embodiment of the directional coupler of FIG. 2 in which the secondaries of the first current sense transformer 21 and the second current sense transformer 23 are inside secondary windings and the auto transformer 29 samples the voltage at terminal B rather than at node point 37.

Figure 7:
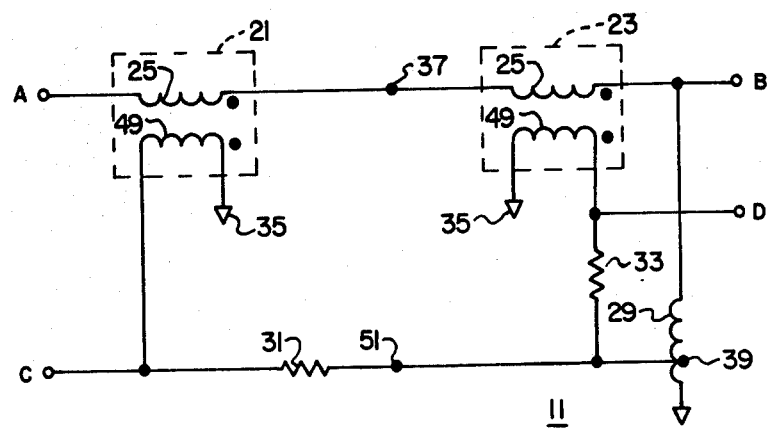

FIG. 7 is yet another embodiment of the directional coupler according to the invention. The voltage probe is again the auto transformer which monitors the voltage at terminal B. The secondary windings of the first current sense transformer 21 and the second current sense transformer 23 are outside secondary windings 49.

Table I provides the connections of terminals A and B of the different embodiments of the directional coupler 11 and also provides the terminals either C or D, upon which the reflected power and the forward power may be retrieved according to the connection of terminals A and B.

TABLE I

| FIG. | A | B | C | D |
|---|---|---|---|---|
| 2 | Source | Load | Reflected Power | Forward Power |
| 2 | Load | Source | Forward Power | Reflected Power |
| 4 | Source | Load | Forward Power | Reflected Power |
| 4 | Load | Source | Reflected Power | Forward Power |
| 7 | Source | Load | Forward Power | Reflected Power |
| 7 | Load | Source | Reflected Power | Forward Power |
| 6 | Source | Load | Reflected Power | Forward Power |
| 6 | Load | Source | Forward Power | Reflected Power |

THEORY OF OPERATION AND DEFINITIONS OF DESIGN PARAMETERS

Figure 8:
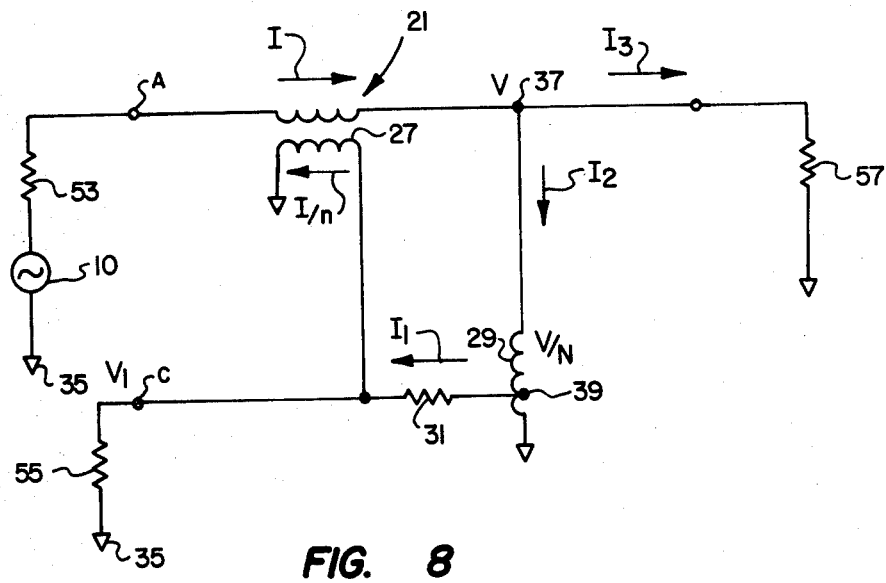
FIGS. 8 and 9 are schematic diagrams used to mathematically explain the operation of the directional coupler.

FIg. 8 is an equivalent circuit of the source half of the directional coupler 4 of FIG. 2 that is incorporated in the embodiment illustrated in FIG. 1 with the load or antenna 7 and second current sense transformer 23 represented by resistor 57. Using FIG. 8 and referring to Table II, the Table of Equations, for optimum directivity, the voltage at terminal C, $V_1$, should approach 0, Equation 1. $I_1$, the current that flows through resistor 31 approaches $I/N$, where N is turns ratio of the current sense transformer 21 and I is the current provided by the signal source 10 and the lumped impedance 53 that represents the circuit elements of FIG. 1 between the radio frequency signal source 10 and terminal A of the directional coupler 11. As $I_1$ approaches $I/N$, the current $I_2$ that flows from node point 37 through the auto transformer 29 becomes equal to the current I divided by $N^2$. This relationship is provided by Equation 3 of the Table of Equations. V, the voltage at node 37, is equal to $I_3$ times the resistance R of resistor 57. In the preferred embodiment, resistor 57 should be balanced and matched to resistor 53 and resistor 55 the termination of resistance of terminal C. Under these conditions, the relationship of the current I that flows through the primary 25 of the first current sense transformer 21 to the voltage V is provided by Equation 4. The resistance of the resistor 31 is designated as $R_0$ in equation 5 and upon the conditions delineated in Equation 1, Equation 6 shows that for optimum directivity $R_0$ should approach the value of R which is illustrated in Equation 7. An ideal directional coupler would have no components of the signal that is present on terminal D present on terminal C and vice versa.

TABLE II

1. OPTIMUM DIRECTIVITY $\rightarrow V_1 \rightarrow 0$.
2. $V_1$ IS THE VOLTAGE AT TERMINAL C, FIG. 8 (DIRECTIVITY CONSIDERATIONS).
3. IF $I_1 \rightarrow \frac{I}{N}$, THEN $I_2 \rightarrow \frac{I}{N^2}$.
4. $V = I_3 R = I\left(\frac{N^2 - 1}{N^2}\right) R \Rightarrow I = \frac{VN^2}{(N^2 - 1)R}$.
5. $R_0 = \left(-V_1 + \frac{V}{N}\right)\frac{N}{I} = \frac{\left(-V_1 + \frac{V}{N}\right)(N^2 - 1)R}{VN}$.

TABLE II-continued

6. $V_1 \rightarrow 0 \Rightarrow R_0 \rightarrow \frac{R(N^2 - 1)}{N^2}$.
7. $\therefore R_0 \approx R$.
8. $V_1 = (V - V_0)N$ IS THE VOLTAGE AT TERMINAL D, FIG. 9 (COUPLING ANALYSIS).
9. $I_1 = \frac{\frac{V}{N} - V_1}{R_0} = \frac{V\left(\frac{1}{N} - N\right) + V_0 N}{R_0} = \frac{\left[V\left(\frac{1 - N^2}{N}\right) + V_0 N\right] N^2}{R(N^2 - 1)}$
10. $I_2 = I_1 + \frac{I}{N}$ and $R \approx \frac{R_0 N^2}{N^2 - 1}$.
11. $V_1 = I_2 R = \left(\frac{I}{N} + I_1\right) R = (V - V_0)N$
12. $I = \frac{V_0}{R} \Rightarrow I = \frac{V - \frac{V_1}{N}}{R} \Rightarrow \frac{I}{N} = \frac{V}{NR} - \frac{V_1}{N^2 R}$.
13. $I_1 = \left(\frac{V}{N} - V_1\right)\frac{1}{R_0} = \frac{\left(\frac{V}{N} - V_1\right)N^2}{R(N^2 - 1)}$
14. $V_1 = \left(\frac{I}{N} + I_1\right) R = \frac{V}{N} - \frac{V_1}{N^2} + \frac{N^2}{N^2 - 1}\left(\frac{V}{N} - V_1\right)$.
15. $V_1 + \frac{V_1}{N^2} + \frac{V_1 N^2}{N^2 - 1} = \frac{V}{N} + \frac{NV}{N^2 - 1}$.
16. $\left[\frac{N^2(N^2 - 1) + N^2 - 1 + N^4}{N^2(N^2 - 1)}\right] = V\left[\frac{2N^2 - 1}{N(N^2 - 1)}\right]$.
17. $\frac{V_1}{V} = \left(\frac{2N^2 - 1}{N(N^2 - 1)}\right)\left(\frac{N^2(N^2 - 1)}{2N^4 - 1}\right) = \frac{2N^3 - N}{2N^4 - 1}$.
18. $\therefore$ COUPLING $\approx \frac{1}{N}$.

Figure 9:
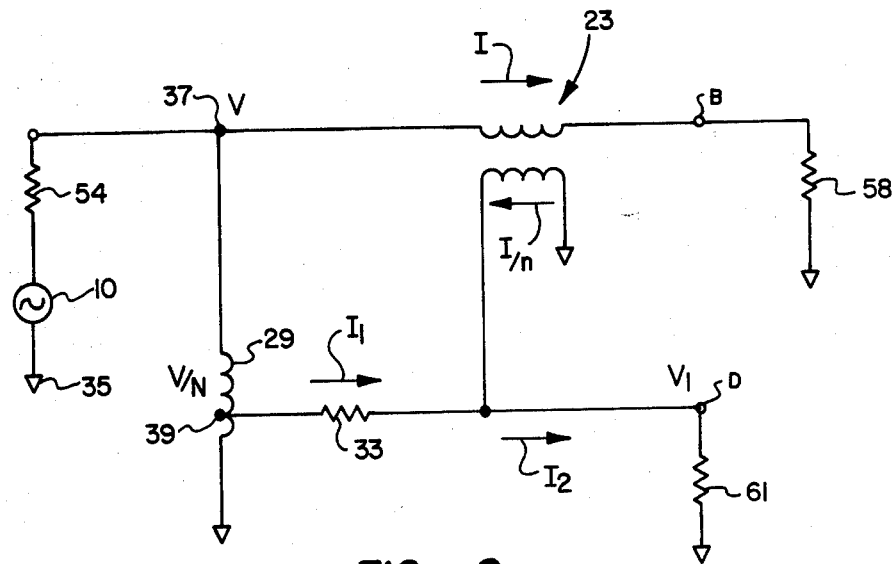

FIG. 9 is a representation of the load half of the schematic diagram of FIG. 2 when connected in the embodiment illustrated in FIG. 1. Signal source 10 drives a load 54 which represents resistor 53 plus the resistance from the first current sense transformer 21. Load 54 ideally should be equal to a resistive value of R. At node 37 there is present a voltage V which produces a current I that flows through the second current sense transformer 23 to terminal B and through resistor 58 the load or antenna 7 of FIG. 1 which ideally should be equal to resistor 54 or 61 (the D terminal termination resistor) which in Table II is designated as R. The voltage sense transformer 29 at its tapped output 39 provides a voltage of V/N where N is the turns of the voltage sense transformer 29. V/N produces a current I that is summed with the current I/N and flows through resistor 61. The voltage at terminal D that results from the current flow $I_2$ through resistor 61 is related to the voltage V, at node 37 and $V_0$, the voltage at terminal B, by Equation 8. The current $I_1$ that flows through resistor 33 which is designated in the Table of Equations as $R_0$ is provided by Equation 9. Equation 10 provides the summation for the current $I_2$ and Equation 11 relates $I_2$ to $V_1$. Equation 12 relates the current I that flows through the primary of the second current sense transformer to the voltage at terminal B and Equation 13 relates the current $I_1$ to the voltage V at node 37 and the voltage $V_1$ at the terminal D. Equation 14, using the previous equations for $I_1$ and $I_2$ provides an alternate equation for $V_1$. $V_1$ is simplified and defined further in Equations 15 and 16, with Equation 17 providing the transfer function of the voltage from node 37 to the signal source 10 to terminal D which indicate that ideally the coupling of the transformers 21 and 23 is 1/N the ratio of the secondary windings to the primary windings where N is the number of turns in the primary winding 25 and the auto transformer has a total number of turns N with the tap 39 being at (N−1) turns from node point 37.

Many changes and modifications in the above-described embodiment of the invention can, of course, be carried out without departing from the scope thereof. Accordingly, the scope is intended to be limited only by the scope of the appended claims.

I claim:

1. A directional coupler with a source terminal, and a load terminal, the directional coupler comprises:
   a first transformer means with a first primary winding, a second transformer means with a second primary winding, the first primary winding and the second primary winding being serially connected between the source terminal and the load terminal at a node point, the first transformer means and the second transformer means for providing an I sample of the current flow through the first and second primary winding;
   a third transformer means for providing a V sample of the voltage that causes the current flow through the first and second primary windings, the third transformer means includes an auto transformer with an input terminal connected to the node point, an output tap, and a reference terminal connected to a reference point; and
   vector adder means for vectorially combining the I sample and the V sample to obtain a first signal representative of the reflected power components of the I sample and the V sample and to provide a second signal representative of the forward power components of the I sample and the V sample.

2. The directional coupler according to claim 1 wherein the first and second transformer means further comprises:
   a first and second secondary winding means for electrically responding to an magnetic field that results from the current flow through the first and second primary windings; and
   balun core means around which the first and second primary windings and the first and second secondary windings are wound for increasing the coupling between the first and second primary winding and the first and second secondary windings.

3. The directional coupler according to claim 1 or 2 wherein the auto transformer comprises:
   a ferromagnetic core with an A and B axial bore and a first and second end;
   a transformer winding path that runs through the A axial bore from the first end to the second end, from the A axial bore to the B axial bore across the second end, from the second end to the first end through the B axial bore, from the B axial bore to the A axial bore across the first end; and
   a transformer winding wound around the transformer path from the input terminal to the reference terminal for at least a preselected number of turns with the output tap being a preselected point on a preselected turn.

4. The directional coupler according to claim 1 or 2 wherein the auto transformer comprises:
   a ferromagnetic core with an A and B axial bore and a first and second end;
   a transformer winding path that runs from the input terminal through the A axial bore from the first end to the second end, from the A axial bore to the B axial bore across the second end, from the second end to the first end through the B axial bore, from the B axial bore to the A axial bore across the first end; and
   a transformer winding wound around the transformer path for at least a preselected number of turns with the output tap being a preselected point on a preselected turn.

5. The directional coupler according to claim 2 wherein the vector adder means comprises:
   a first resistor means for connecting the first end of the first secondary winding means to the output tap; and
   a second resistor means for connecting a first end of the second secondary winding means to the output tap.

6. A radio transmission system with a radio transmitter, an antenna and a directional coupler system having a directional coupler connected between the radio transmitter and the antenna, the directional coupler comprising:
   a source terminal;
   a load terminal;
   a first transformer means with a first primary winding, a second transformer means with a second primary winding, the first primary winding and the second primary winding being serially connected between the source terminal and the load terminal at a node point, the first transformer means and the second transformer means for providing an I sample of the current flow through the first and second primary winding;
   a third transformer means for providing a V sample of the voltage that causes the current flow through the first and second primary windings, the third transformer means including an auto transformer with an input terminal connected to the node point, an output tap, and a reference terminal connected to a reference point; and
   vector adder means for vectorially combining the I sample and the V sample to obtain a first signal representative of the reflected power components of the I sample and the V sample and to provide a second signal representative of the forward power components of the I sample and the V sample.

7. The radio transmission system according to claim 6 wherein the first and second transformer means further comprises:
   a first and second secondary winding means for electrically responding to an magnetic field that results from the current flow through the first and second primary windings; and
   balun core means around which the first primary and the first and second secondary windings are wound for increasing the coupling between the first and second primary windings and the first and second secondary windings.

8. The radio and transmission system according to claim 6 or 7 wherein the auto transformer comprises:
   a ferromagnetic core with an A and B axial bore and a first and second end;
   a transformer winding path that runs from the input terminal through the A axial bore from the first end to the second end, from the A axial bore to the B axial bore across the second end, from the second end to the first end through the B axial bore, from the B axial bore to A axial bore across the first end; and
   a transformer winding wound around the transformer path from the input terminal to the reference terminal for at least a preselected number of turns with the output tap being a preselected point on a preselected turn.

9. The radio transmission system according to claim 6 or 7 wherein the auto transformer comprises;
   a ferromagnetic core with an A and B axial bore and a first and second end;
   a transformer winding path that runs from the input terminal through the A axial bore from the first end to the second end, from the A axial bore to the B axial bore across the second end, from the second end to the first end through the B axial bore, from the B axial bore to the A axial bore across the first end; and
   a transformer winding wound around the transformer path for at least a preselected number of turns with the output tap being a preselected point on a preselected turn.

10. The radio transmission system according to claim 7 wherein the vector adder means comprises;
   a first resistor means for connecting the first end of the first secondary winding means to the output tap; and
   a second resistor means for connecting a first end of the second secondary winding means to the output tap.

* * * * *